US006484231B1

(12) United States Patent
Kim

(10) Patent No.: US 6,484,231 B1
(45) Date of Patent: Nov. 19, 2002

(54) SYNCHRONOUS SRAM CIRCUIT

(75) Inventor: Kyung Saeng Kim, Choongcheongbuk-Do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/337,664

(22) Filed: Jun. 22, 1999

(30) Foreign Application Priority Data

Nov. 10, 1998 (KR) .............................. 98-47965

(51) Int. Cl.[7] .............................................. G06F 12/02
(52) U.S. Cl. ........................ 711/105; 711/218; 711/203; 711/168; 365/189.01
(58) Field of Search ................................ 711/104, 105, 711/128, 218, 118, 217, 203, 3, 167, 168; 345/515, 521; 365/236; 305/230.06, 189.01; 713/501

(56) References Cited

U.S. PATENT DOCUMENTS

| 4,149,239 | A | * | 4/1979 | Jenkins et al. | 711/108 |
| 4,151,593 | A | * | 4/1979 | Jenkins et al. | 711/167 |
| 5,421,000 | A | * | 5/1995 | Fortino et al. | 365/189.01 |
| 5,522,056 | A | * | 5/1996 | Watanabe et al. | 711/128 |
| 5,588,130 | A | * | 12/1996 | Fujishima et al. | 711/118 |
| 5,835,970 | A | * | 11/1998 | Landry et al. | 711/218 |
| 5,897,651 | A | * | 4/1999 | Cheong et al. | 711/3 |
| 5,940,875 | A | * | 8/1999 | Inagaki et al. | 711/217 |
| 6,014,732 | A | * | 1/2000 | Naffziger | 711/203 |
| 6,219,746 | B1 | * | 4/2001 | Vogley | 711/104 |
| 6,230,250 | B1 | * | 5/2001 | Vogley | 711/218 |

OTHER PUBLICATIONS

Yokomizo et al. "Design Techniques for High–Throughput BiCMOS Self–Timed SRAM's", pp. 484–489, IEEE Journal of Solid State Circuits, vol. 28, No. 4, Apr. 1993.
Nakamura et al. A 220–MHz Pipelined 16 Mb BiCMOS SRAM with PLL Proportional Self–Timing Generator, pp. 1317–1322, IEEE Journal of Solid State Circuits, vol. 29, No. 11, Nov. 1994.

* cited by examiner

Primary Examiner—Matthew Kim
Assistant Examiner—B. R. Peugh
(74) Attorney, Agent, or Firm—Fleshner & Kim, LLP

(57) ABSTRACT

A memory device is provided that latches a plurality of data larger than a number of input or output bits and sequentially controls the transmission of the data for input/output preferably using a higher speed clock. The memory device can be a synchronous SRAM circuit that includes a control unit outputting a burst mode signal, an address decoder receiving an externally inputted address signal and the burst mode signal, outputting an internal address signal and a block coding signal, and a counter enabled by the burst mode signal and counting the block coding signal and outputting a coding signal. A multiplexer receives cell data from a plurality of sense amplifiers of the sense amplifier to concurrently latch the plurality of cell data having a prescribed number of bits larger than the number of external input and output bits and outputs one cell data among a plurality of the cell data in accordance with the coding signal. The latched data can be sequentially output to the outside using the counter.

19 Claims, 7 Drawing Sheets

FIG.7C

| BMS | Cycle | CLK | S1 | S2 | S3 | S4 | N1 | N2 | N3 | BWC |
|---|---|---|---|---|---|---|---|---|---|---|
| Low | x | Low | OFF | OFF | OFF | OFF | Low | High | Low | Low |
| High | 1st | High | OFF | ON | OFF | ON | Low | High | Low | Low |
| | | Low | ON | OFF | ON | OFF | High | High | Low | Low |
| | 2nd | High | OFF | ON | OFF | ON | High | Low | Low | Low |
| | | Low | ON | OFF | ON | OFF | High | Low | High | Low |
| | 3rd | High | OFF | ON | OFF | ON | High | Low | High | High |

SYNCHRONOUS SRAM CIRCUIT

BACKGROUND OF THE INVENTION

1. Field of the Invention

The present invention relates to a memory device, and in particular to a synchronous SRAM circuit.

2. Background of the Related Art

FIG. 1 illustrates a related art synchronous SRAM circuit. As shown in FIG. 1, a cell array 6 includes a plurality of cells each storing a cell data. The plurality of the cells are grouped within a plurality of cell blocks 61 through 64. The following description of the related art SRAM assumes the number of the cell blocks 61 through 64 and the number of column selection signals C/S:n are four (4), respectively.

An address register 1 latches an external address signal Add inputted from the outside in accordance with a clock signal CLK. In accordance with the clock signal CLK, a control register 2 latches various control signals Cout such as read and write signals, and control signals /ADSP, /ADSC, /ADV, which are used for determining the burst mode. A control unit 3 receives control signals /ADSP and /ADSC from the control register 2 and controls corresponding elements.

A counter 4 counts a column selection signal C/S:n inputted from the address register 1 in accordance with a burst mode signal BMS to generate an internal address signal. An address decoder 5 selects one cell among the cells of the cell array 6 and allows a corresponding cell data to be outputted from the selected cell in accordance with the external address signal Add or the internal address signal.

A sense amplifier 7 is formed of a plurality of sense amplifiers 71 through 74. Each of the sense amplifiers 71–74 is connected with a corresponding one of the cell blocks 61 through 64 and receives a cell data for amplification from the corresponding one of the cell blocks 61 through 64. An output register 8 latches a cell data latched by the sense amplifier 7 and outputs the stored cell data to an input and output pad 9 under control of the control unit 3. The data is output to the outside from the input and output pad 9.

In addition, an internal register (not shown) is further provided for inputting a new cell data to the sense amplifier 7 (i.e., a writing operation) under control of the control unit 3. The description of the internal register is omitted.

A cell data reading operation of the related art synchronous SRAM will now be described. An external address signal Add inputted to the address register 1 is latched in accordance with a clock signal CLK and is inputted into the counter 4 and the address decoder 5, respectively. The control signals /ADSP, /ADSC, /ADV inputted into the control register 2 are latched by the control register 2 in accordance with the clock signal CLK.

The control unit 3 determines the level of a control signal CS, which is based on the logic states of the control signals /ADSP, /ADSC, /ADV. The control unit 3 combines the control signals /ADSP and /ADSC to generate a burst mode signal BMS. The counter 4 is enabled by the burst signal BMS and counts the column selection signal C/S:n inputted from the address register 1. As a result, the counter 4 outputs the internal address signal to the address decoder 5.

The address decoder 5 decodes the external address signal or the internal address signal and outputs the decoded signal to the cell array 6. In addition, the address decoder 5 outputs cell block coding signals ANI_I and ANO_I. One block is selected from a plurality of cell blocks 61 through 64. If the counter 4 does not generate the internal address, the address decoder 5 decodes the external address signal Add.

One cell in the cell block is selected in accordance with a decoding signal from the address decoder 5. The cell data stored in the selected cell is amplified by the sense amplifier 7 and is latched by the output register 8. The latched cell data is outputted from the output register 8 to the outside through the input and output pad 9 in accordance with a control signal from the control unit 3.

The method of the related art SRAM for selecting a plurality of cells is determined based on whether the address inputted into the address decoder 5 is the external address or the internal address. When the address decoder 5 operates in accordance with the external address signal Add, the operation of the entire circuit is performed in synchronization with an external clock signal CLK. This is called single read mode. When the address decoder 5 operates in accordance with an internal address signal from the counter 4, the operation of the entire circuit is performed irrespective of the external clock signal. This is called burst read mode.

The single and burst read modes will now be described with reference to FIG. 2 assuming that a number of clock pulses used for implementing a read operation of the related art SRAM is two (2). Namely, it is assumed that the latency is 2. In addition, the description assumes that one data is formed of four cell data, and each cell data is formed of a word unit.

FIG. 2 is a wave form diagram illustrating timing of each element of the related art synchronous SRAM circuit. FIG. 2 illustrates the clock signal CLK, the control signals /ADSP, /ADSC, /ADV, the address signal Add, and data DATA Out. The two control signals /ADSP and /ADSC are used for setting the burst read mode. If both the control signals /ADSP and /ADSC are low level, the entire circuit operates in the burst read mode. According to the timing of FIG. 2, at a time t1 where a first clock signal is generated, the mode is the single read mode, and at the time after the time t1, the mode is the burst read mode.

At the time t1 shown in FIG. 2, when the first clock signal is generated, the external address $A_o$ is latched, and the cell data stored in a predetermined cell is read in accordance with the external address $A_o$. The read cell data $Q1(A_o)$ is latched into the output register 8 through the sense amplifier 7.

At the time t2, if the second clock signal is generated, the cell data $Q1(A_o)$ stored in the output register 8 is outputted to the outside, and the external address signal A1 is latched. At the time t2, the first cell data $Q1(A_o)$ is outputted to the outside, and the second cell data $Q1(A1)$ is latched to the output register 8. Therefore, as described hereinabove, two clock pulses are used until the cell data $Q1(A_o)$ is outputted after an external address is inputted.

At the time t2, the cell data $Q1(A_o)$ stored in the output register 8 is outputted, and at the same time the control signal /ADSC is shifted to a low level. At this time, since the control signal /ADSP is also a low level, the entire circuit begins to operate in the burst read mode. Namely, it is determined whether the mode is the burst read mode at every time t1, t2, t3, . . . at which each clock pulse is generated.

If the control signal /ADV is a low level in the burst read mode, the counter 4 increases the internal address. Namely, the counter 4 counts the column selection signal CS:n. The counted value is inputted into the address decoder 5, and the address decoder 5 outputs a decoded signal for the first cell block 61 of the cell array 6, and the cell data in the interior of the coded cell block 61 is read. The cell data read from the cell block 61 is latched to the output register 8 through the first sense amplifier 71.

If the internal address is increased by the counter 4, the second block 62 of the cell array 6 is coded, and the cell data in the interior of the coded block 62 is read. The cell data read from the cell block 62 is latched to the output register 8 through the second sense amplifier 72. The above-described operation is repeated until the four cell data forming the corresponding data are outputted. Thus, the four cell data Q1(A1), Q2(A1), Q3(A1), Q4(A1) form one data.

The four cell data Q1(A1), Q2(A1), Q3(A1), Q4(A1) are sequentially outputted. To output the four cell data, five clock pulse signals are used. In other words, in the related art SRAM two clock signals are used for outputting one of the cell data. The first clock signal among two clock signals used for outputting the second word (i.e., the second data) shares the second clock signal of the first word. Since the remaining three words are outputted after the first word is outputted, the number of clock signals used for outputting the data formed of the four words is 2+3=5. In addition, the number of the clock signals are the same in the single mode and the burst mode.

In a synchronous SRAM, the data output speed is an important element in determining the system performance. In the related art, another method for increasing the data output speed of an SRAM synchronizes the system to a short period clock signal. However, according to the following articles, the pipeline depth of that SRAM is also increased. See the IEEE Journal of Solid-State Circuits. Vol., 28, No=4,. April, 1993, p48–p489, "Design Techniques for High-Throughput BiCMOS Self-Timed SRAMs". See also the IEEE Journal of Solid-State Circuits. Vol., 29, No=11, November 1994, p1317–p1312, "Design Techniques for High-Throughput BiCMOS Self-Timed SRAMs". To increase the pipeline depth, the latency should be increased. Upon increasing the latency, the size of the output register is increased. Accordingly, the area of the circuit for the output register is increased. In this case, the latch register should be located before the sense amplifier, which further requires a very difficult technique.

In addition, for the related art SRAM of FIG. 1, the time required to input the address and store the read data in the output latch through the sense amplifier is more than 65% of the entire access time. These time requirements are illustrated in FIG. 3. Accordingly, the operation speed (frequency) of the related art SRAM or memory chip is determined based on the above-described operations. Therefore, decreasing the operation time shown in FIG. 3 would increase the operation speed of the chip.

The above references are incorporated by reference herein where appropriate for appropriate teachings of additional or alternative details, features and/or technical background.

SUMMARY OF THE INVENTION

An object of the present invention is to provide a synchronous SRAM circuit that substantially overcomes one or more of the problems caused by disadvantages encountered in the related art.

Another object of the present invention is to provide a memory device circuit that increases an operation speed by allowing the synchronous SRAM to operate at a clock signal having an increased speed or shorter period.

Another object of the present invention is to provide a synchronous SRAM circuit that decreases the time required until a cell data is outputted to the outside through a sense amplifier relative to a given pipeline depth by synchronizing to a fast clock.

Another object of the present invention is to provide a synchronous SRAM circuit outputting data latched to an output register in accordance with a signal having a short clock pulse.

Another object of the present invention is to provide a synchronous SRAM circuit that is capable of latching at one time data having a predetermined number of bits larger than the number of external input and output bits and sequentially outputting the data to the outside using a counter.

Another object of the present invention is to provide a synchronous SRAM that reads a plurality of cell data at one time and sequentially outputs the data.

Another object of the present invention is to provide a synchronous SRAM circuit that operates at a high clock speed by reading a plurality of cell data at a time in a burst read mode and then sequentially outputting a latched data to the outside in accordance with an internal address signal.

To achieve at least the above objects in a whole or in parts, there is provided a synchronous SRAM circuit according to the present invention that includes a control unit outputting a burst mode signal, an address decoder receiving an externally inputted address signal and the burst mode signal, outputting an internal address signal and a block coding signal, a counter enabled by the burst mode signal and counting the block coding signal and outputting a coding signal, and a multiplexer receiving cell data from a plurality of sense amplifier units of a sense amplifier and outputting one cell data among a plurality of the cell data in accordance with the coding signal.

To further achieve the above objects in a whole or in parts, there is provided a circuit for controlling an operation of a cell array formed of a plurality of cells having a matrix form of rows and columns and an output circuit coupled to the cell array to output selected cell data according to the present invention that includes an address decoder that receives an address signal and a burst mode signal and outputs an internal address signal and a block coding signal, a counter enabled by the burst mode signal that counts the block coding signal and outputs a coding signal and a multiplexer that receives a plurality of selected cell data from the output circuit in accordance with the coding signal from the counter and outputs the plurality of selected cell data.

To further achieve the above objects in a whole or in parts, there is provided a memory device according to the present invention that includes a memory array that outputs a plurality of cell data in accordance with a first control signal, a controller that receives an address signal and a mode signal and generates the first control signal and a second control signal and a selector coupled to the memory array that receives the plurality of cell data and outputs the plurality of cell data in accordance with the second control signal.

To further achieve the above objects in a whole or in parts, there is provided a memory device according to the present invention that includes a storage unit formed of a plurality of cells having a matrix form of rows and columns for storing data, an output unit coupled to the storage unit for outputting selected cell data, an address decoding unit for receiving an address signal and a burst mode signal and outputting an internal address signal and a block coding signal, a counter unit for counting the block coding signal and outputting a coding signal, wherein the counter unit is enabled by the burst mode signal and a multiplexer unit for substantially concurrently receiving a plurality of selected cell data from the output circuit in accordance with the coding signal from the counter and outputting the plurality of selected cell data.

To further achieve the above objects in a whole or in parts, there is provided a method of operating a memory device, wherein the memory device includes a cell array formed of a plurality of cells having a matrix form of rows and columns according to the present invention that includes receiving an address signal and a burst mode signal and outputting an internal address signal and a block coding signal to the cell array to select a plurality of cell data, counting the block coding signal and outputting a coding signal, where counting step is initiated by the burst mode signal, sensing the selected plurality of cell data from the cell array and substantially concurrently receiving the plurality of selected cell data from the output circuit in accordance with the coding signal from the counter and outputting the plurality of selected cell data.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 7C is a table illustrating a logic state of elements of FIG. 7A based on a condition of FIG. 7B.

DESCRIPTION OF THE PREFERRED EMBODIMENTS

Preferred embodiments of a synchronous SRAM according to the present invention includes a control unit that outputs a first and second mode signals. The preferred embodiment further includes a counter counting block coding signals ANO_I and ANI_I inputted from an address decoder and outputting a coding signal. The block coding signals are further used by a memory array to output data. A multiplexer receiving cell data from the memory array and outputs one cell data among a plurality of inputted cell data in accordance with the coding signal.

Figure 1:
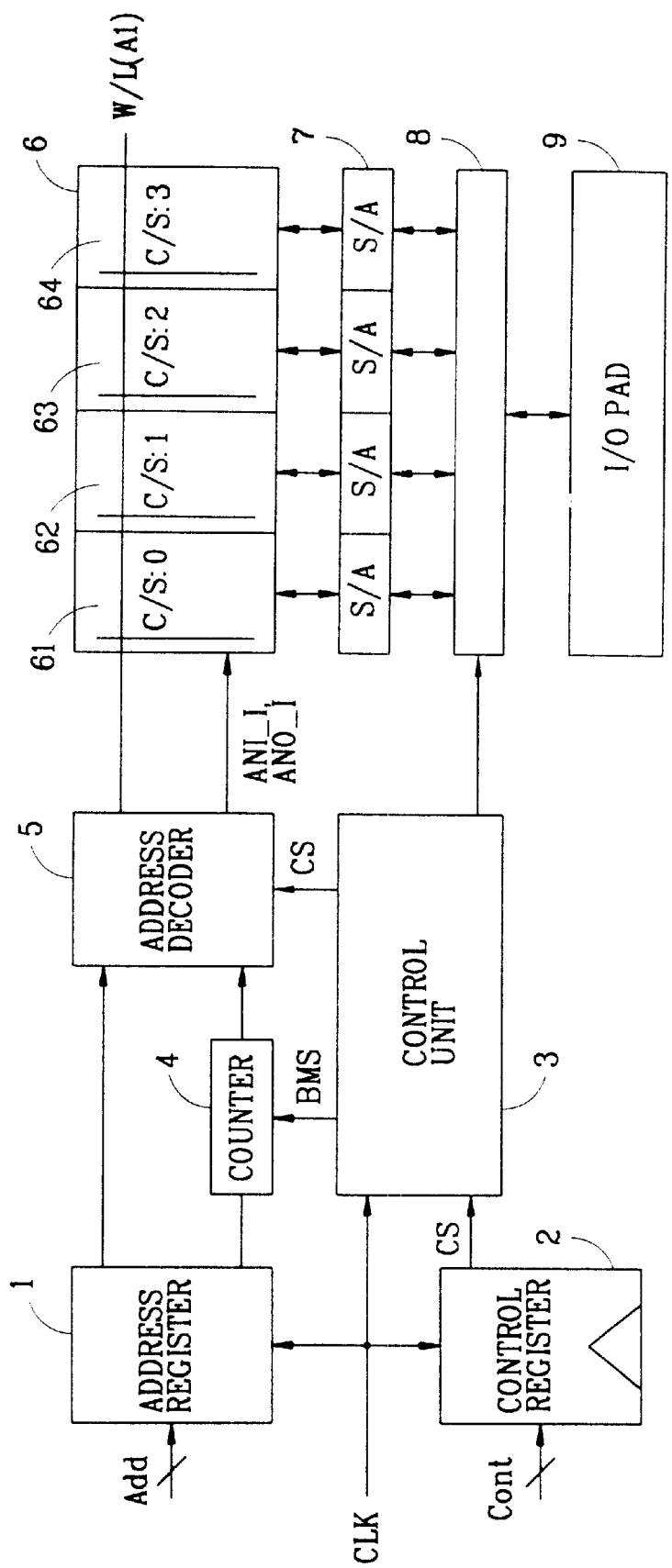
FIG. 1 is a block diagram illustrating a related art synchronous SRAM circuit.
Figure 2:
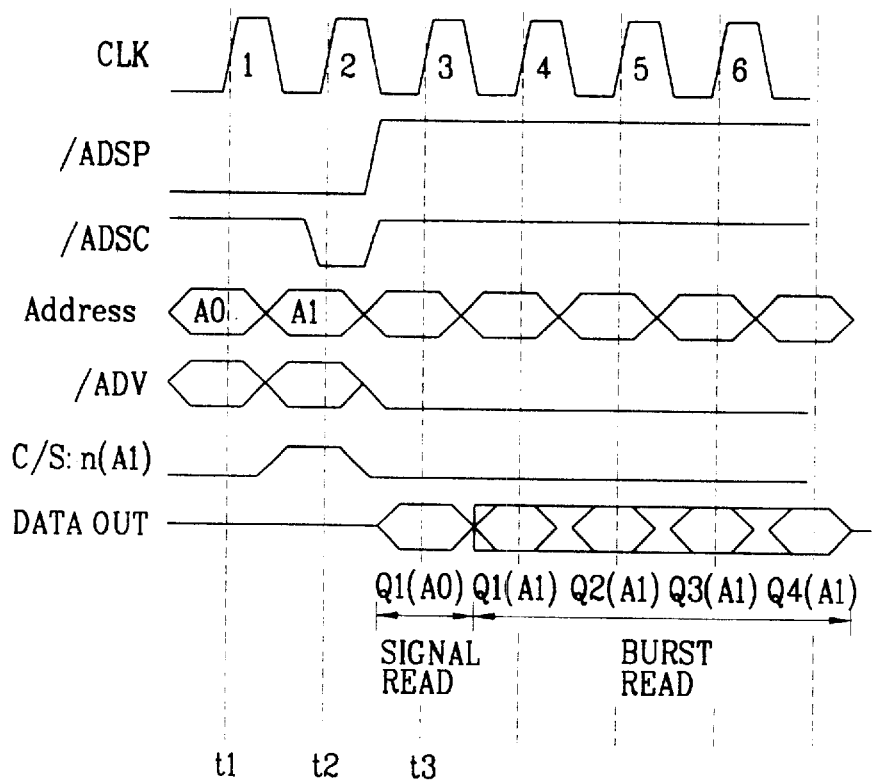
FIG. 2 is a wave form diagram illustrating timing of elements of FIG. 1 in a read mode.
Figure 3:
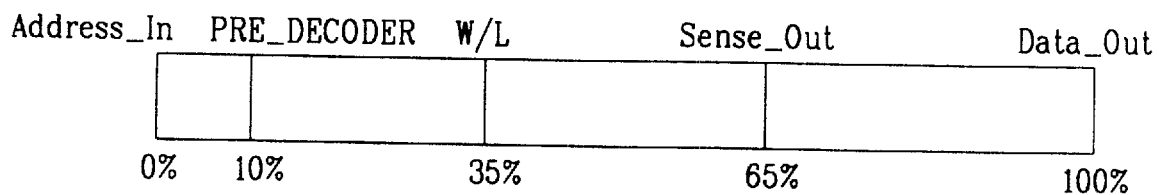
FIG. 3 is a diagram illustrating an operation time of elements of the SRAM circuit of FIG. 1 as a percentage of the entire operation time.
Figure 4:
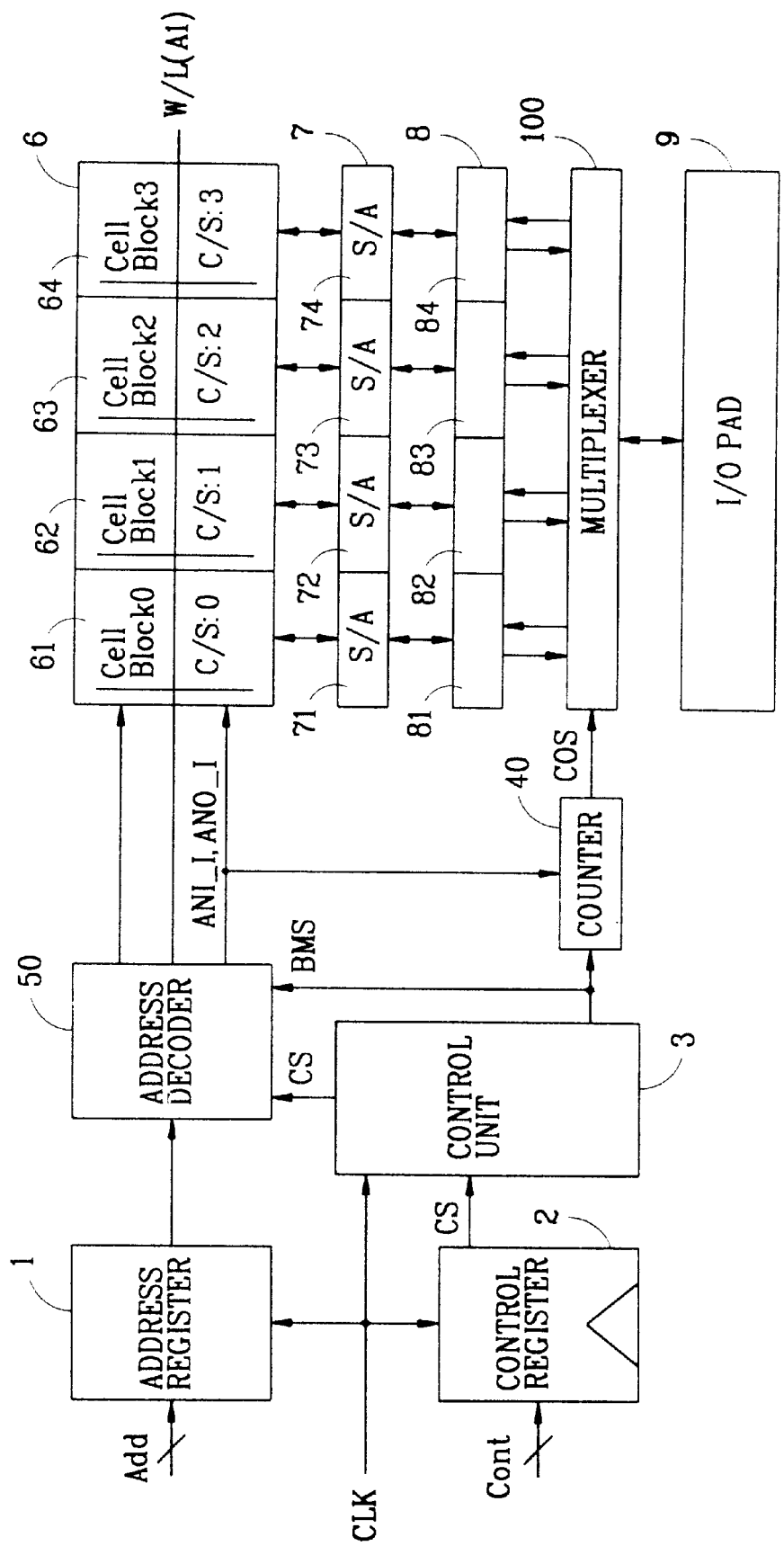
FIG. 4 is a diagram illustrating a preferred embodiment of a synchronous SRAM according to the present invention.

FIG. 4 illustrates a first preferred embodiment of a synchronous SRAM circuit according to the present invention. As shown in FIG. 4, construction of the address register 1, the control register 2, the control unit 3, the cell array 6, the sense amplifier 7, the output register 8, and the input and output pad 9 is similar to the related art SRAM of FIG. 1. Accordingly, a detailed description is omitted.

An address decoder 50 in the first preferred embodiment receives an external address signal Add from the address register 1 and a burst mode signal BMS from the control unit 3 for generating an internal address signal. The counter 40 is enabled by the burst mode signal BMS and counts the block coding signals ANO_I and ANI_I inputted from the address decoder 50 and outputs a coding signal COS. The multiplexer 100 receives cell data from the sense amplifiers 71 through 74 of the sense amplifier 7 and outputs one cell data among the inputted cell data to the input and output pad 9.

Figure 6:
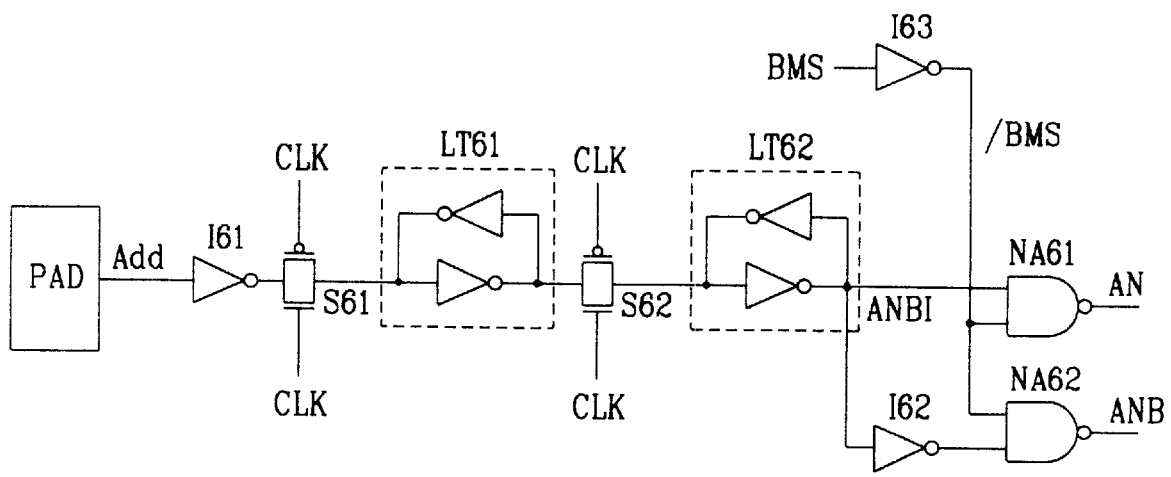
FIG. 6 is a circuit diagram illustrating an exemplary circuit for an address decoder of FIG. 4.

FIG. 6 illustrates an exemplary circuit according to the present invention for the address decoder 50. As shown in FIG. 6, the external address signal Add inputted through a pad passes through a first inverter I61, a first transmission gate S61 operating in accordance with the clock signal CLK, a first buffer LT61, a second transmission gate S62 operating in accordance with the clock signal CLK, and a second buffer LT62. In addition, a signal ANBI output by the second buffer LT62 is directly inputted into one input terminal of a first NAND-gate NA61 and into one input terminal of a second NAND-gate NA62 through a second inverter I62, respectively. The burst mode signal BMS is inputted from the control unit 3 to the other input terminals of the first and second NAND-gates NA61 and NA62 through a third inverter I63. Output signals AN and ANB from the first and second NAND-gates NA61 and NA62 are internal address signals.

Figure 5:
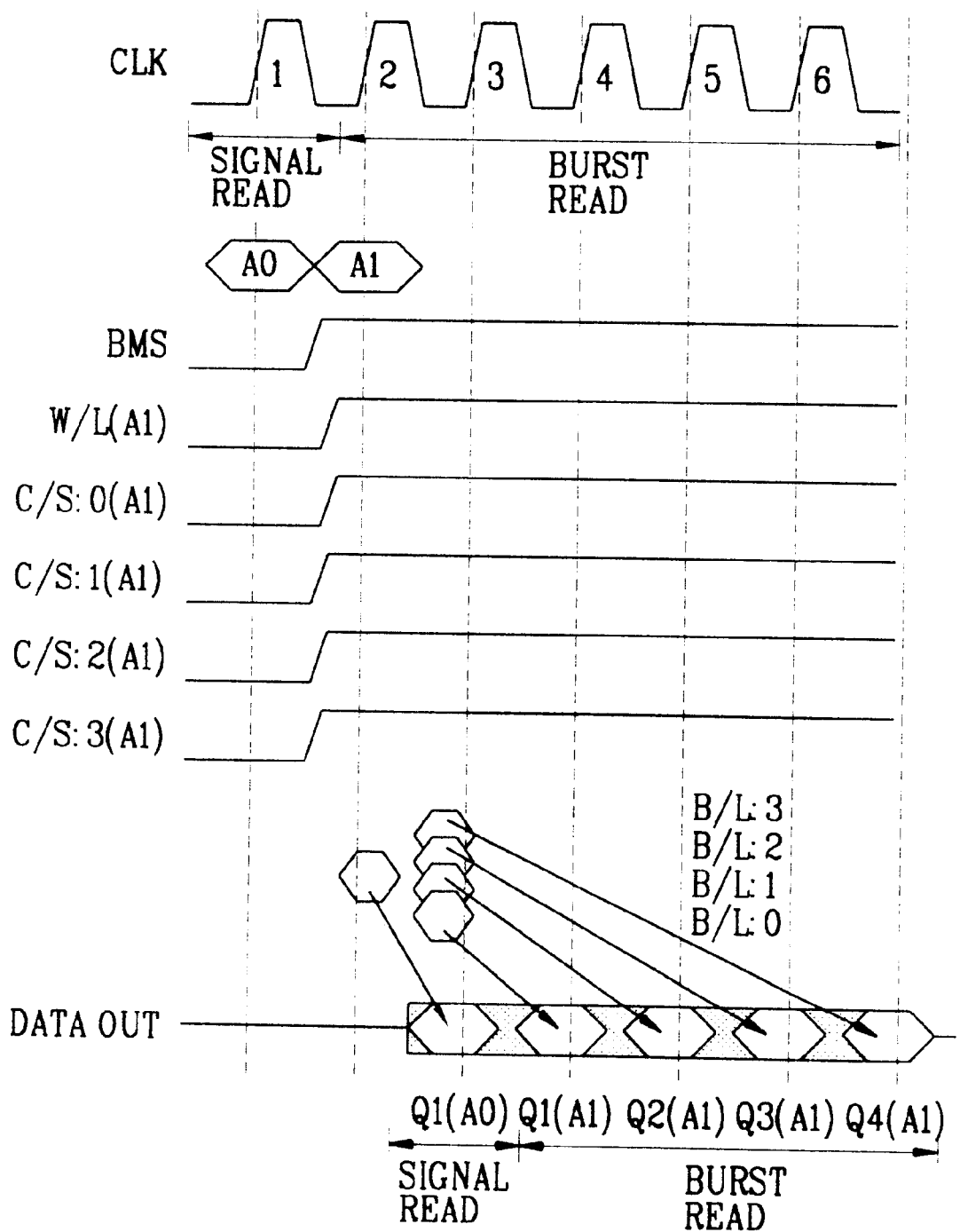
FIG. 5 is a wave form diagram illustrating timing of elements of FIG. 4 in a read mode.

Operations of the first preferred embodiment of the synchronous SRAM circuit according to the present invention will now be described. FIG. 5 is a wave form diagram illustrating exemplary timing of elements of the first preferred embodiment of FIG. 4 in a read operation. FIG. 5 shows a clock pulse signal CLK, the burst mode signal BMS, a column selection signal C/S:n(A1), and data Data out) outputted to the outside.

The external address signal Add is latched by the address register 1 and then is inputted into the address decoder 50. Control signals /ADSP, /ADSC, /ADV are latched by the control register 2 and are inputted into the control unit 3.

The control unit 3 receives the latched control signals /ADSP, /ADSC, /ADV and outputs a control signal CS to the address decoder 50 to enable the address decoder 50. The control unit 3 also combines the two control signals /ADSP, /ADV and generates the burst mode signal BMS. The burst mode signal BMS is outputted to the address decoder 50 and the counter 40, respectively. The burst mode signal BMS is a high level in the burst mode, and is a low level in a second mode.

The address decoder 50 is enabled by the control signal CS and combines the external address signal Add and the burst mode signal BMS to generate the internal address signals AN and ANB. The address decoder 50 decodes the internal address signals AN and ANB to enable a plurality of word lines and a plurality of column lines coupled to the cell array 6. In addition, the address decoder 50 outputs the cell block coding signals ANI_I and ANO_I to the counter 40.

Operations of the address decoder 50 to combine the external address signal Add and the burst mode signal BMS will now be described. As shown in FIG. 6, the external address signal Add inputted through the pad preferably sequentially passes through the first inverter I61, the first transmission gate S61, the first buffer LT61, the second transmission gate S62, and the second buffer LT62 so that a level of the external address signal Add is inverted. The inverted address signal ANBI is inverted by the second inverter I62, and the level of the burst mode signal BMS is inverted by the third inverter I63. The address signal ANBI is NANDed with the inverted burst mode signal /BMS by the first NAND-gate NA61 to generate the internal address signal AN. In addition, the address signal ABNI inverted by the second inverter I62 is NANDed with the inverted burst mode signal /BMS by the second NAND-gate NA62 to generate the internal address signal ANB.

An operational mode of the first preferred embodiment of the SRAM is preferably determined between at least a single mode and the burst mode in accordance with a logic state of the burst mode signal BMS. Read operations of the first preferred embodiment of the SRAM will be described based on the single mode and the burst mode. If the operational mode is the single read mode, the burst mode signal BMS is a low level. This condition corresponds to the time when the first clock pulse CLK shown in FIG. 5 is generated. Since the inverted burst mode signal /BMS inputted into the first and second NAND-gates NA61 and NA62 is a high level, the logic states of the internal address signals AN and ANB outputted from the first and second NAND-gates NA61 and NA62 are determined by the external address signal Add. Thus, the functional operation of the first preferred embodiment in the single read mode is similar to the operation of the related art system.

In the burst mode, the burst mode signal BMS is a high level. This condition corresponds to the time when the second clock pulse CLK shown in FIG. 5 is generated. The inverted burst mode signal /BMS is a low level. Therefore, the logic states of two internal address signals AN and ANB are high levels irrespective of the external address signal Add.

In the burst mode, since the two internal address signals AN and ANB are high levels, a plurality of word lines W/L of the cell blocks 61 through 64 of the cell array and the column lines C/S:0 through C/S:3 of the cell blocks 61 through 64 are preferably enabled so that four cell blocks of the cell array 6 are concurrently selected. The word lines W/L(A1) and the column lines C/S:0(A1) through C/S:3 (A1) as shown in FIG. 5 are high states in the burst mode.

The cell data Q1(A1) through Q1(A4) of each cell of the selected four cell blocks 61 through 64 are amplified by the four sense amplifiers 71 through 74 of the sense amplifier 7 and are respectively latched to each of respective output registers 81 through 84 of the output register 8. The latched four cell data Q1(A1) through Q1(A4) are inputted into the multiplexer 100 from the output register 8.

When the third clock pulse is generated as shown in FIG. 5, the counter 40 counts the clock coding signals ANI_I and ANO_I inputted from the address decoder 50, generates the coding signal COS and outputs the coding signal COS to the multiplexer 100.

Since the two block coding signals ANI_I and ANO_I are signals for designating the block, the two signals are combined for enabling the multiplexer 100. Therefore, the multiplexer 100 sequentially outputs four cell data Q1(A1) through Q1(A4) one by one. In the present invention, since the number of blocks is assumed to be four, two block coding signals are used. However, the present invention is not intended to be so limited. The outputted cell data is transmitted to the outside through the input/output pad 9.

In the single read mode according to the first preferred embodiment of the present invention, one block signal is preferably used for storing the cell data into the output register 8 in accordance with an external address. In this case, the number of the cell data bits is the same as the number of the external input/output bits. However, in the burst mode according to the first preferred embodiment of the SRAM, the number of the cell data bits is preferably larger than the number of the external input/output bits.

In the related art, the first cell data is stored into the output register for a first clock cycle. The stored first cell data is outputted to the outside for a second clock cycle, and the second cell data is stored in the output register.

However, in the first preferred embodiment of the synchronous SRAM, four cell data are stored into the multiplexer through the output register for the first clock cycle. Four cell data are sequentially outputted from the second clock cycle one by one, and the cell data is not sensed from the second clock cycle. Therefore, since the cell data is not sensed from the second clock cycle, it is possible to decrease the clock cycle (i.e., increase the clock frequency).

Therefore, in the first preferred embodiment the time until the first cell data is outputted is preferably the same as the time in the related art. However, since the time until the second cell data is outputted is decreased, the clock signal for outputting the second data in the first preferred embodiment has a cycle shorter than the clock signal for outputting the second data compared to the related art. Therefore, as the number of words forming the data is increased, the more the entire time for transmitting the data is decreased relative to the related art.

Accordingly, in the burst mode, the clock synchronization may be implemented for a fast clock signal to obtain an SRAM speed increase. Since the operation speed of the chip is determined by the speed after the sending operation is performed, the first preferred embodiment of the SRAM obtains about a 15% speed increase compared to the related art.

In addition, in the related art, when the word line is enabled by the decoding signal and other word lines are enabled by the next decoding signal, the previously selected word line is disabled. Therefore, during the read operation, enabling a corresponding word line and disabling other word lines are automatically performed.

However, in the first preferred embodiment of the synchronous SRAM according to the present invention, since four word lines are enabled at the same time, the loss of the current flowing at the cell is increased. To prevent the above-described problems, a control unit can disable the word line after the time for selecting the cell by the word line and transferring the data stored in the cell to the sense amplifier is elapsed. Thus, the control unit disables the word line after the time for outputting the cell data has elapsed.

Figure 7A:
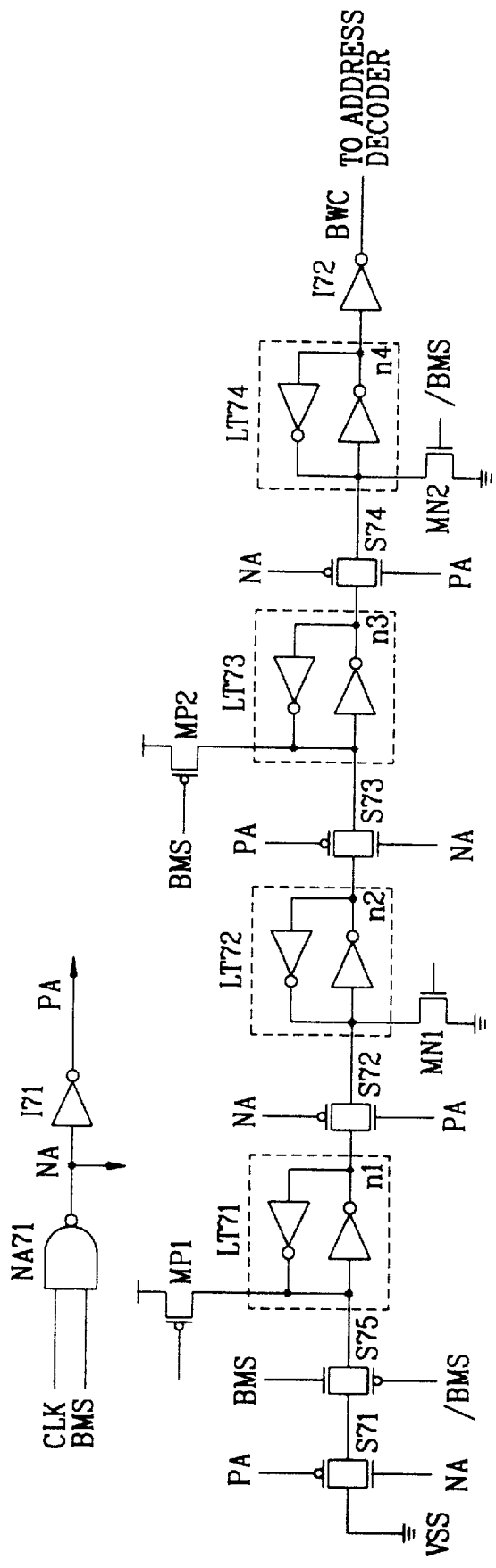
FIG. 7A is a circuit diagram illustrating an exemplary circuit for a control unit of FIG. 4.

FIG. 7A illustrates an exemplary circuit of a control unit 3' of FIG. 4 for disabling the word line. The control unit 3' can preferably disable the word line using the third clock signal in the burst mode because the cell data are outputted during two clock pulses.

As shown in FIG. 7A, the control unit 3' includes a NAND-gate NA71 for NANDing the clock signal CLK and the burst mode signal BMS, and a first inverter I71 for inverting an output signal NA of the NAND-gate NA71. In addition, the control unit 3' preferably includes four latches LT71 through LT74 coupled in series. Transmission gates S71 through S74 are turned on and off by the output signal NA and the output signal PA. The transmission gates S71 through S74 are preferably coupled to a corresponding one of the latches LT71–LT74. First and second PMOS transistors MP1 and MP2 operate in accordance with the burst mode signal BMS. The transistors MP1 and MP2 are coupled between a power voltage VCC and the (n+1)th latches LT71 and LT73. First and second NMOS transistors MN1 and MN2 are coupled to ground and operate in accordance with the inverted burst mode signal /BMS. The transistors MN1 and MN2 are coupled between the ground and the (2n)th latches LT72 and LT74. In addition, the input terminal of the first transmission gate S71 is coupled to the ground. A fifth transmission gate S75 is turned on/off in accordance with the burst mode signal BMS. The fifth transistor gate S75 is coupled between the output terminal of the first transmission gate S71 and the first latch LT71. A second inverter I72 is connected with the output terminal of the fourth latch LT74, and an output signal BMC from the second inverter I72 is applied to the address decoder 50.

Figure 7B:
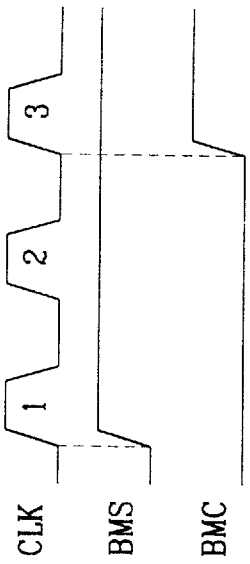
FIG. 7B is a wave form diagram illustrating timing of elements of FIG. 7A.

Operations for disabling the word line according to the first preferred embodiment will now be described. FIG. 7B is a diagram that illustrates exemplary timing of the clock signal CLK, the burst mode signal BMS, and the output signal BMC. FIG. 7C is a table that illustrates exemplary logic states of elements of FIG. 7A based on the condition as shown in FIG. 7B.

When the burst mode signal BMS is a low level, the output signal NA from the NAND-gate NA71 maintains a high level, and the output signal PA from the first inverter I71 maintains a low level. At this time, the fifth transmission gate S75 is turned off, and four switching transistors MP1, MP2, MN1 and MN2 are turned on. A node n4, which is an output terminal of the fourth latch LT74, maintains a high level, and the output signal BMC from the second inverter I72 is reset to a low level.

At the rising edge of the first clock pulse, the burst mode signal BMS becomes a high level, the output signal NA becomes a high level, and the output signal PA becomes a low level. The four switching transistors MP1, MP2, MN1 and MN2 are turned off by the burst mode signal BMS, and the fifth transmission gate S75 is turned on so that the input terminal of the first latch LT71 maintains a low level. In addition, the second and fourth transmission gates S72 and S74 are turned off by the output signals NA and PA. Therefore, the node n4 maintains a high level, and the output signal BMC from the inverter I72 maintains a low level.

Whenever the logic state of the clock pulse is changed, the logic states of the output signals NA and PA are changed, so that four transmission gates S71 through S74 are repeatedly turned on and off, and the low level of the input terminal of the first latch LT71 is shifted. As shown in FIG. 7B, at the rising edge of the third clock pulse, the output signal BMC from the inverter I72 becomes a high level. When the output signal BMC becomes a high level, all word lines are disabled, so that when the word line is turned on, the flow of the DC current is blocked. The portions indicated by the broken line in the wave form of the word line W/L(A1) as shown in FIG. 5 indicate that the cell data are sensed-out and then the word line is disabled.

As described above, preferred embodiments of a synchronous SRAM according to present invention have various advantages. In the burst mode, the number of the cell data outputted is larger than the number of the external input/output bits. In the preferred embodiments, a plurality of cell data are stored into a plurality of output registers in the first clock cycle, and the stored cell data are sequentially outputted to the outside from the second clock cycle. The cell data are not sensed from the second clock cycle, which decreases the time required for sensing the data. In addition, as the amount of the cell data is increased, the more the time is decreased. Further, the operation speed of preferred embodiments of an SRAM chip is determined based on the speed after the sensing operation. In the burst mode, since it is possible to synchronize to a fast clock signal, the speed is increased by about 15% compared to the related art.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for controlling an operation of a cell array formed of a plurality of cells having a matrix form of rows and columns and an output circuit coupled to the cell array to output selected cell data, comprising:

an address decoder that receives an address signal and a burst mode signal and outputs an internal address signal and a block coding signal;

a counter enabled by the burst mode signal that counts the block coding signal and outputs a coding signal; and a multiplexer that receives a plurality of selected cell data from the output circuit in accordance with the coding signal from the counter and outputs the plurality of selected cell data.

2. The circuit of claim 1, wherein the cell array receives the internal address signal and forms a plurality of cell blocks, and wherein the output circuit comprises:

a sense amplifier formed of a plurality of sense amplifier units, wherein each of the sense amplifier units is. coupled to a corresponding one of the cell blocks; and an output register coupled to the sense amplifier, and wherein the multiplexer is coupled to the output register.

3. The circuit of claim 1, wherein the address decoder enables a plurality of word lines at the same time in the burst mode.

4. The circuit of claim 3, wherein the circuit operates in one of a burst mode and a single read mode, and wherein the address decoder outputs a high level internal address signal irrespective of an external address signal in the burst mode.

5. The circuit of claim 1, wherein the address decoder comprises:

a pair of serially coupled first and second transmission gates and latches, wherein the first latch is between the first and second transmission gates, wherein the second latch is coupled to the second transmission gate, wherein the first transmission gate receives the address signal and the second latch outputs a buffered address signal;

a first logic gate that logically processes the buffered address signal;

a second logic gate that logically processes the burst mode signal;

a third logic gate that logically processes the buffered address signal and an output signal from the second logic gate and generates a first internal address signal; and a fourth logic gate that logically processes an output signal from the first logic gate and the output signal from the second logic gate and generates a second internal address signal.

6. The circuit of claim 5, wherein the first and second logic gates are inverters and the third and fourth logic gates are NAND-gates.

7. The circuit of claim 1, further comprising a control unit that outputs the burst mode signal, wherein the control unit outputs a word line disabling signal to the address decoder after the plurality of selected cell data output to the output circuit by the address decoder in accordance with the burst mode signal.

8. The circuit of claim 7, wherein the control unit comprises:
a first logic gate that logically processes a clock signal and the burst mode signal;
a second logic gate that logically processes an output signal from the first logic gate;
a plurality of latches and a plurality of transmission gates alternately connected in series, wherein each of the transmission gates is turned on and off in accordance with the output signal from the first logic gate and an output signal from the second logic gate;
a first transistor connected with a (n+1)th latch and a first prescribed reference voltage that is operated by the burst mode signal;
a second transistor connected with a (2n)th latch and a second prescribed voltage that is operated in accordance with an inverted burst mode signal;
a mode control transmission gate turned on and off in accordance with the burst mode signal, wherein the mode control transmission gate is connected between an output terminal of the first transmission gate and the first latch; and
a third logic gate coupled to an output terminal of a final latch of the plurality of latches, wherein an output signal from the third logic gate is applied to the address decoder.

9. The circuit of claim 8, wherein the second and third logic gates are inverters, the first logic gate is a NAND-gate, and wherein the input terminal of the first transmission gate is connected with a ground.

10. The circuit of claim 8, wherein the address decoder comprises:
a pair of serially coupled first and second transmission gates and latches, wherein the first latch is between the first and second transmission gates, wherein the second latch is coupled to the second transmission gate, wherein the first transmission gate receives the address signal and the second latch outputs a buffered address signal;
a first logic gate that logically processes the buffered address signal;
a second logic gate that logically processes the burst mode signal;
a third logic gate that logically processes the buffered address signal and an output signal from the second logic gate and generates a first internal address signal; and
a fourth logic gate that logically processes an output signal from the first logic gate and the output signal from the second logic gate and generates a second internal address signal.

11. A memory device, comprising:
a memory array that outputs a plurality of cell data in accordance with a first control signal;
a controller that receives an address signal and generates the first control signal and a second control signal; and
a selector coupled to the memory array that receives the plurality of cell data and outputs the plurality of cell data under control of a third control signal determined in accordance with the second control signal, wherein the controller comprises,
an address decoder that outputs a block coding signal as the second control signal, and
a first circuit coupled to the address decoder that combines the block coding signal and outputs a coding signal as the third control signal.

12. The memory device of claim 11, wherein the address decoder includes:
a first logic gate that logically processes the external address signal;
a second logic gate that logically processes the burst mode signal;
a third logic gate that logically processes the external address signal and an output signal from the second logic gate and generates a first internal address signal; and
a fourth logic gate that logically processes an output signal from the first logic gate and the output signal from the second logic gate and generates a second internal address signal.

13. The memory device of claim 11, comprising:
a control unit that outputs a burst mode signal, wherein the address decoder and the first circuit are enabled in accordance with the burst mode signal, and wherein the selector is a multiplexer and the first circuit is a counter.

14. The circuit of claim 13, wherein the control unit outputs a word line disabling signal to the address decoder after a plurality of cell data are latched to the output register in the cell array by the address decoder in accordance with the burst mode signal.

15. The circuit of claim 14, wherein the control unit comprises:
a first logic gate that logically processes a clock signal and the burst mode signal;
a second logic gate that logically processes an output signal from the first logic gate;
a plurality of latches and a plurality of transmission gates alternately connected in series, wherein each of the transmission gates is turned on and off in accordance with the output signal from the first logic gate and an output signal from the second logic gate;
a first transistor connected with a (n+1)th latch and a first prescribed reference voltage that is operated by the burst mode signal;
a second transistor connected with a (2n)th latch and a second prescribed voltage that is operated in accordance with an inverted burst mode signal;
a mode control transmission gate turned on and off in accordance with the burst mode signal, wherein the mode control transmission gate is connected between an output terminal of the first transmission gate and the first latch; and
a third logic gate coupled to an output terminal of a final latch of the plurality of latches, wherein an output signal from the third logic gate is applied to the address decoder.

16. A memory device, comprising:
storage means formed of a plurality of cells having a matrix form of rows and columns for storing data;
output means coupled to the storage means for outputting selected cell data;
address decoding means for receiving an address signal and a burst mode signal and outputting an internal address signal and a block coding signal;
counter means for counting the block coding signal and outputting a coding signal, wherein the counter means is enabled by the burst mode signal; and multiplexer means for substantially concurrently receiving a plurality of selected cell data from the output circuit in accordance with the coding signal from the counter and outputting the plurality of selected cell data.

17. The device of claim 16, wherein the address decoder means comprises:

a pair of serially coupled first and second transmission gates and latches, wherein the first latch is between the first and second transmission gates, wherein the second latch is coupled to the second transmission gate, wherein the first transmission gate receives the address signal and the second latch outputs a buffered address signal;

first logic means for logically processing the buffered address signal;

second logic means for logically processing the burst mode signal;

third logic means for logically processing the processing the buffered address signal and an output signal from the second logic gate and generating a first internal address signal; and fourth logic means for logically processing an output signal from the first logic gate and the output signal from the second logic gate and generating a second internal address signal.

18. The device of claim 16, further comprising control means comprising:

first logic means for logically processing a clock signal and the burst mode signal;

second logic means for logically processing an output signal from the first logic gate;

a plurality of latches and a plurality of transmission gates alternately connected in series, wherein each of the transmission gates is turned on and off in accordance with the output signal from the first logic gate and an output signal from the second logic gate;

a first transistor connected with a (n+1)th latch and a first prescribed reference voltage that is operated by the burst mode signal;

a second transistor connected with a (2n)th latch and a second prescribed voltage that is operated in accordance with an inverted burst mode signal;

a mode control transmission gate turned on and off in accordance with the burst mode signal, wherein the mode control transmission gate is connected between an output terminal of the first transmission gate and the first latch; and third logic means for logically processing an output signal of a final latch of the plurality of latches, wherein an output signal from the third logic means is applied to the address decoder.

19. A method of operating a memory device, wherein the memory device includes a cell array formed of a plurality of cells having a matrix form of rows and columns, the method comprising:

receiving an address signal and a burst mode signal and outputting an internal address signal and a block coding signal to the cell array to select a plurality of cell data;

counting the block coding signal and outputting a coding signal, wherein counting step is initiated by the burst mode signal;

sensing the selected plurality of cell data from the cell array; and substantially concurrently receiving the plurality of selected cell data from the output circuit in accordance with the coding signal from the counter and outputting the plurality of selected cell data.

* * * * *